(12) United States Patent
Teng et al.

(10) Patent No.: US 11,848,233 B2
(45) Date of Patent: *Dec. 19, 2023

(54) SEMICONDUCTOR PACKAGE AND MANUFACTURING METHOD THEREOF

(71) Applicant: Taiwan Semiconductor Manufacturing Company, Ltd., Hsinchu (TW)

(72) Inventors: Po-Yuan Teng, Hsinchu (TW); Bor-Rung Su, New Taipei (TW); De-Yuan Lu, Taipei (TW); Hao-Yi Tsai, Hsinchu (TW); Tin-Hao Kuo, Hsinchu (TW); Tzung-Hui Lee, New Taipei (TW); Tai-Min Chang, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/705,378

(22) Filed: Mar. 27, 2022

(65) Prior Publication Data
US 2022/0216103 A1   Jul. 7, 2022

Related U.S. Application Data

(63) Continuation of application No. 16/504,328, filed on Jul. 7, 2019, now Pat. No. 11,289,373.

(Continued)

(51) Int. Cl.
*H01L 21/768* (2006.01)
*H01L 23/48* (2006.01)
(Continued)

(52) U.S. Cl.
CPC .... *H01L 21/76871* (2013.01); *H01L 21/0274* (2013.01); *H01L 21/565* (2013.01);
(Continued)

(58) Field of Classification Search
CPC .......... H01L 21/76871; H01L 21/0274; H01L 21/565; H01L 21/76816; H01L 21/76877;
(Continued)

(56) References Cited

U.S. PATENT DOCUMENTS 11,289,373 B2 * 3/2022 Teng .................. H01L 21/565

* cited by examiner

*Primary Examiner* — Fernando L Toledo
*Assistant Examiner* — Neil R Prasad
(74) *Attorney, Agent, or Firm* — JCIPRNET

(57) ABSTRACT

A method includes the following steps. A seed layer is formed over a structure having at least one semiconductor die. A first patterned photoresist layer is formed over the seed layer, wherein the first patterned photoresist layer includes a first opening exposing a portion of the seed layer. A metallic wiring is formed in the first opening and on the exposed portion of the seed layer. A second patterned photoresist layer is formed on the first patterned photoresist layer and covers the metallic wiring, wherein the second patterned photoresist layer includes a second opening exposing a portion of the metallic wiring. A conductive via is formed in the second opening and on the exposed portion of the metallic wiring. The first patterned photoresist layer and the second patterned photoresist layer are removed. The metallic wiring and the conductive via are laterally wrapped around with an encapsulant.

20 Claims, 17 Drawing Sheets

Related U.S. Application Data

(60) Provisional application No. 62/712,243, filed on Jul. 31, 2018.

(51) Int. Cl.
*H01L 23/31* (2006.01)
*H01L 23/00* (2006.01)
*H01L 21/027* (2006.01)
*H01L 21/56* (2006.01)

(52) U.S. Cl.
CPC .. *H01L 21/76816* (2013.01); *H01L 21/76877* (2013.01); *H01L 23/3107* (2013.01); *H01L 23/481* (2013.01); *H01L 24/08* (2013.01); *H01L 24/49* (2013.01); *H01L 2224/02331* (2013.01); *H01L 2224/02372* (2013.01)

(58) Field of Classification Search
CPC ... H01L 23/3107; H01L 23/481; H01L 24/08; H01L 24/49; H01L 2224/02331; H01L 2224/02372
See application file for complete search history.

SEMICONDUCTOR PACKAGE AND MANUFACTURING METHOD THEREOF

CROSS-REFERENCE TO RELATED APPLICATION

This application is a continuation application of and claims the priority benefit of a prior application Ser. No. 16/504,328 filed on Jul. 7, 2019. The prior application Ser. No. 16/504,328 claims the priority benefits of U.S. provisional application Ser. No. 62/712,243 filed on Jul. 31, 2018. The entirety of each of the above-mentioned patent applications is hereby incorporated by reference herein and made a part of this specification.

BACKGROUND

The semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more of the smaller components to be integrated into a given area. These smaller electronic components also require smaller packages that utilize less area than previous packages. Currently, integrated fan-out packages are becoming increasingly popular for their compactness. The improved routing capability and reliability provided by the integrated fan-out packages are key factors for future packages.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
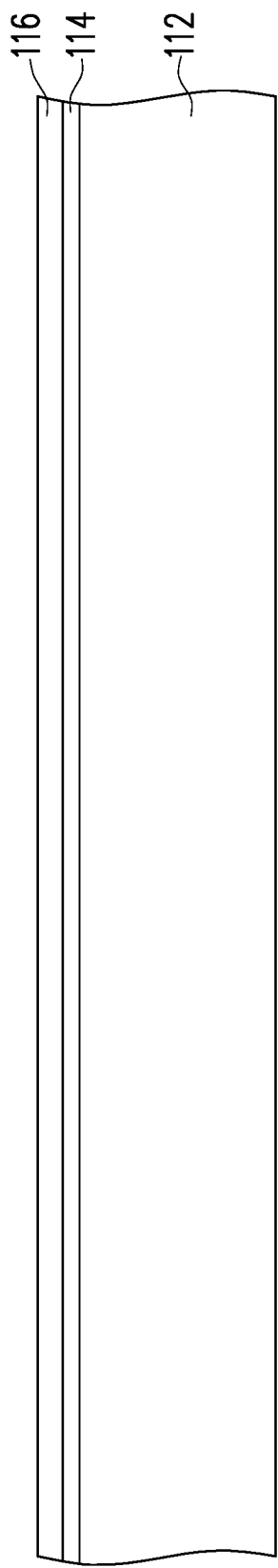
FIG. 1 to FIG. 18 are schematic cross sectional views of various stages in a manufacturing method of a semiconductor package according to some exemplary embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first", "second", "third" and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1 to FIG. 18 are schematic cross sectional views of various stages in a manufacturing method of a semiconductor package according to some exemplary embodiments of the present disclosure. In exemplary embodiments, the manufacturing method is part of a wafer level packaging process. In some embodiments, one die is shown to represent plural dies of the wafer, and one package 10 is shown to represent plural semiconductor packages obtained following the semiconductor manufacturing method.

Referring to FIG. 1, in some embodiments, a carrier 112 with a debond layer 114 and a buffer layer 116 coated thereon is provided. In some embodiment, the carrier 112 may be a glass carrier or any suitable carrier for carrying a semiconductor wafer or a reconstituted wafer for the manufacturing method of the semiconductor package. In some embodiments, the debond layer 114 is disposed on the carrier 112, and the material of the debond layer 114 may be any material suitable for bonding and debonding the carrier 112 from the above layer(s) (e.g., the buffer layer 116) or any wafer(s) disposed thereon. In some embodiments, the debond layer 114 may include a release layer (such as a light-to-heat conversion ("LTHC") layer) or an adhesive layer (such as a ultra-violet curable adhesive or a heat curable adhesive layer).

As shown in FIG. 1, in some embodiments, the buffer layer 116 is disposed on the debond layer 114, and the debond layer 114 is located between the carrier 112 and the buffer layer 116. In some embodiments, the buffer layer 116 may be a dielectric material layer. In some embodiments, the buffer layer 116 may be a polymer layer which is made of polyimide, polybenzoxazole (PBO), benzocyclobutene (BCB), or any other suitable polymer-based dielectric material. In some embodiments, the buffer layer 116 may be Ajinomoto Buildup Film (ABF), Solder Resist film (SR), or the like. The top surface of the buffer layer 116 may be levelled and may have a high degree of coplanarity.

Figure 2:
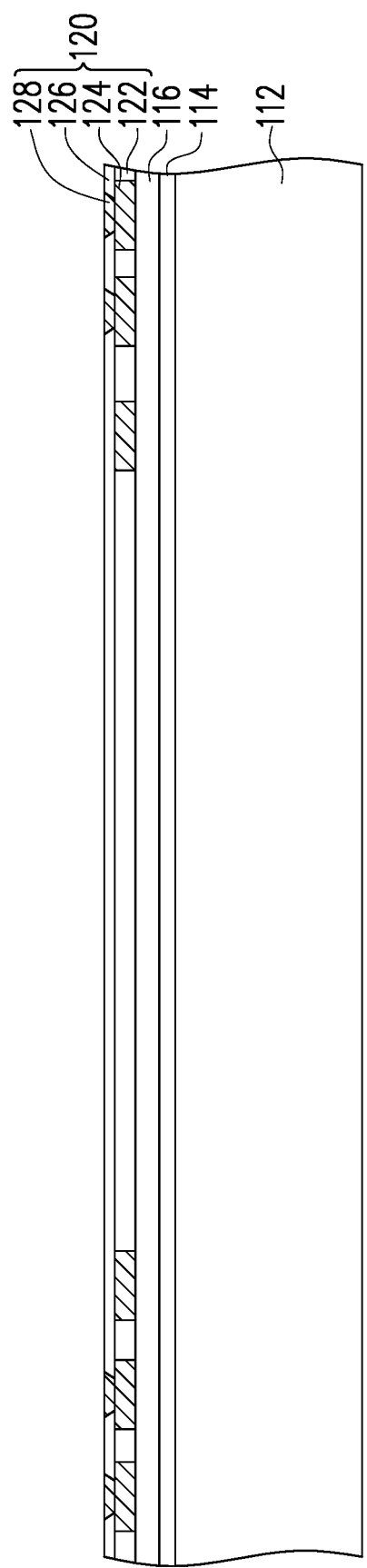

Referring to FIG. 2, in some embodiments, a redistribution structure 120 is formed over the carrier 112. For example, in FIG. 2, the redistribution structure 120 is formed on the buffer layer 116, and the formation of the redistribution structure 120 includes sequentially forming one or more polymer dielectric layers and one or more metallization layers in alternation. In some embodiments, the redistribution structure 120 includes two polymer dielectric layers 122, 126 and two metallization layers which including a plurality of conductive lines 124 and a plurality of conductive vias 128, respectively, as shown in FIG. 2. However, the numbers of the metallization layers and the polymer dielectric layers included in the redistribution structure 120 is not limited thereto. For example, the numbers of the metallization layers and the polymer dielectric layers may be one or more than one. Due to the configuration of the polymer dielectric layers 122/126 and the metallization layers (including conductive lines 124 and conductive vias 128), a routing function is provided to the structure 100.

In some embodiments, the method of forming the redistribution structure 120 includes the following steps. First, a seed layer (not shown) is formed on the top surface of the buffer layer 116. The seed layer may be formed by a physical vapor deposition process or the like. Then, a patterned photoresist layer (not shown) having a plurality of openings exposing portions of the seed layer is formed over the seed layer. Then, a plating process is performed to form a plurality of conductive lines 124 on the seed layer within the openings of the patterned photoresist layer. Thereafter, the patterned photoresist layer is removed and the seed layer not covered by is removed (e.g., by an etching process). A polymer dielectric layer is then formed to cover the conductive lines 124 and a polishing process is performed to partially remove the polymer dielectric layer until the conductive lines 124 are revealed. After performing the polishing process on the polymer dielectric layer, the polymer dielectric layer 122 with a reduced thickness is formed and top surfaces of the conductive lines 124 are exposed. In some embodiments, the polymer dielectric layer 126 and the conductive vias 128 may be formed using similar methods as the polymer dielectric layer 122 and the conductive lines 124 described above, and the detailed description is thus omitted herein.

In some embodiments, the material of the polymer dielectric layers 122, 126 may include polyimide, benzocyclobutene (BCB), polybenzoxazole (PBO), or any other suitable polymer-based dielectric material. In some embodiments, the material of the conductive lines 124 and the conductive vias 128 may include aluminum, titanium, copper, nickel, tungsten, and/or alloys thereof.

Figure 3:
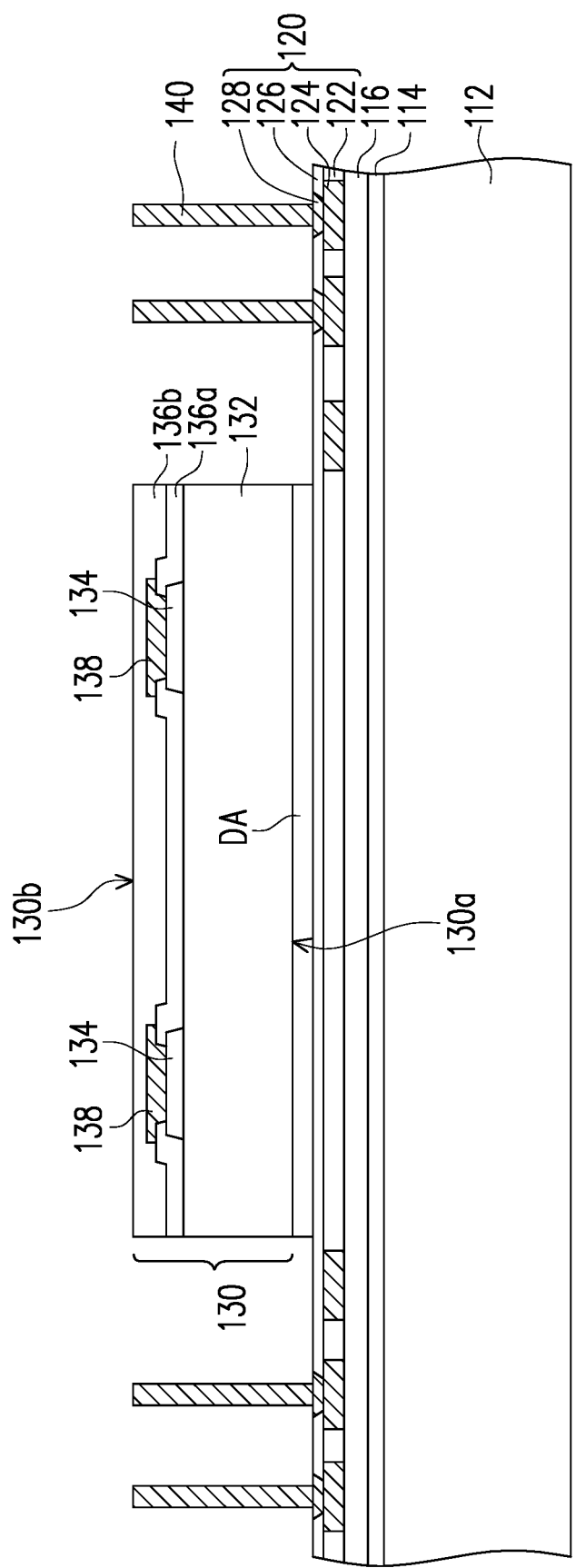

Referring to FIG. 3, in some embodiments, after the redistribution structure 120 is formed, at least one semiconductor die 130 is disposed on the redistribution structure 120 and a plurality of through vias 140 is provided on the redistribution structure 120. In some embodiments, the semiconductor die 130 is picked and placed onto the polymer dielectric layer 126. Only one semiconductor die 130 is shown herein, but two or more semiconductor dies may be provided or placed on the redistribution structure 120. The semiconductor die 130, for example, includes a semiconductor substrate 132, a plurality of conductive pads 134, a passivation layer 136a, a plurality of conductive pillars 138, and a protection layer 136b. In some embodiments, the conductive pads 134 are disposed over the semiconductor substrate 132. The passivation layer 136a is formed over the semiconductor substrate 132 and has contact openings that partially expose the conductive pads 134. The conductive pillars 138 are formed on the conductive pads 134. In addition, the protection layer 136b is formed on the passivation layer 136a to cover the conductive pillars 138. In some embodiments, the protection layer 136b has a sufficient thickness to encapsulate and fully cover the conductive pillars 138. In some embodiments, the conductive pillars 138 may be exposed from the protection layer 136b.

In some embodiments, the semiconductor substrate 132 may be a silicon substrate including active components (e.g., transistors or the like) and/or passive components (e.g., resistors, capacitors, inductors, or the like) formed therein. The conductive pads 134 may be aluminum pads, copper pads, or other suitable metallic pads. In some embodiments, the passivation layer 136a and/or the protection layer 136b may be a polybenzoxazole (PBO) layer, a polyimide (PI) layer or other suitable polymers. In some alternative embodiments, the passivation layer 136a and/or the protection layer 136b may be made of inorganic materials, such as silicon oxide, silicon nitride, silicon oxynitride, or any suitable dielectric material. In certain embodiments, the materials of the passivation layer 136a and/or the protection layer 136b may be the same or different.

As shown in FIG. 3, the semiconductor die 130 has a rear surface 130a and a front surface 130b opposite to the rear surface 130a. In some embodiments, the rear surface 130a of the semiconductor die 130 is attached (or adhered) to the polymer dielectric layer 126 through a die attach film DA. On the other hand, the front surface 130b of the semiconductor die 130 facing upward is exposed. In certain embodiments, the die attach film DA is first disposed on a rear surface 130a of the semiconductor die 130, then the semiconductor die 130 is attached to the redistribution structure 120 by placing the die attach film DA between the semiconductor die 130 and the redistribution structure 120. Alternatively, the die attach film DA is firstly placed on the redistribution structure 120 and then the semiconductor die 130 is placed on the die attach film DA. With the die attach film DA, a better adhesion between the semiconductor die 130 and the redistribution structure 120 is ensured. Although one semiconductor die 130 is illustrated in FIG. 3, it construes no limitation in the disclosure. In some alternative embodiments, more than one semiconductor die 130 may be picked and placed onto the redistribution structure 120. In some embodiments, the redistribution structure 120 is referred as a back-side redistribution structure of the semiconductor die 130.

It is noted that, the semiconductor die 130 described herein may be referred as a chip or an integrated circuit (IC). In an alternative embodiment, the semiconductor die 130 described herein may be semiconductor devices. In certain embodiments, the semiconductor die 130 may include one or more digital chips, analog chips or mixed signal chips, such as application-specific integrated circuit ("ASIC") chips, sensor chips, wireless and radio frequency (RF) chips, memory chips, logic chips or voltage regulator chips. In certain embodiments, the semiconductor die 130 may further include additional semiconductor die(s) of the same type or different types. In an alternative embodiment, the additional semiconductor die(s) may include digital chips, analog chips or mixed signal chips, such as ASIC chips, sensor chips, wireless and RF chips, memory chips, logic chips or voltage regulator chips.

As shown in FIG. 3, the through vias 140 are formed on the redistribution structure 120 surrounding the semiconductor die 130. In some embodiments, the method of forming the through vias 140 includes the following steps. A patterned photoresist layer (not shown) having openings, of which the locations are corresponding to those of the conductive vias 128, is formed over the redistribution structure 120. Then, a plating process is performed and through vias 140 are formed in the openings defined in the patterned photoresist layer, wherein the through vias 140 are disposed on and in contact with the conductive vias 128. After the through vias 140 are formed, the patterned photoresist layer is removed. In addition, the formation of the through vias 140 may further include forming a seed layer (not shown). In some alternative embodiments, the through vias 140 may be pre-fabricated through vias 140 and are provided by pick and place onto the corresponding conductive vias 128 of the redistribution structure 120.

Figure 4:
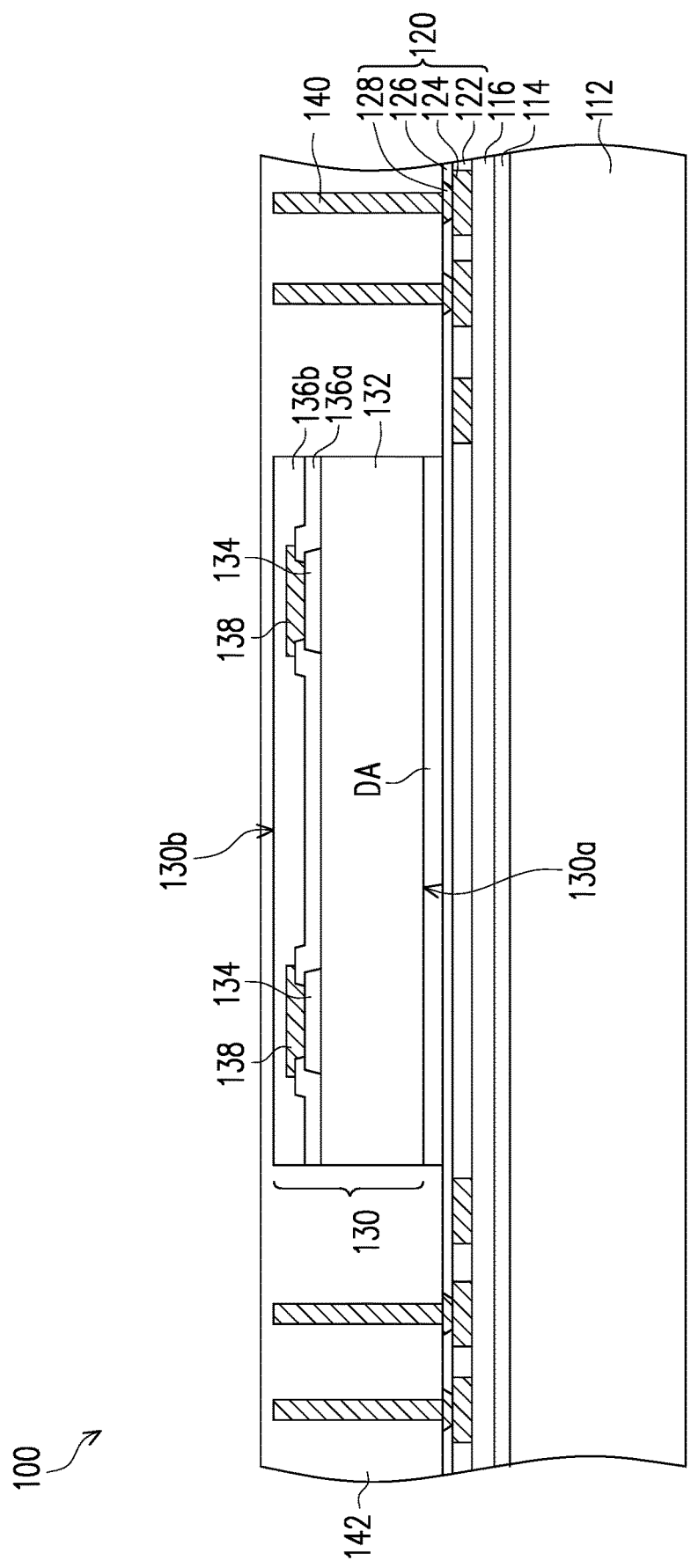

Referring to FIG. 4, in some embodiments, one or more semiconductor dies 130 and the plurality of through vias 140 are encapsulated in the encapsulation material 142. In some embodiments, the encapsulation material 142 covers the semiconductor die 130 and the plurality of through vias 140, where the semiconductor die 130 and the plurality of through vias 140 are not accessibly revealed by the encapsulation material 142. In some embodiments, the encapsulation material 142 is formed over the semiconductor die 130, the plurality of through vias 140 and the redistribution structure 120. For example, as shown in FIG. 4, the encapsulation material 142 covers the semiconductor die 130, the plurality of through vias 140 and a surface of the redistribution structure 120 exposed by the semiconductor die 130 and the plurality of through vias 140. In other words, the encapsulation material 142 is over-molded over the semiconductor die 130, the plurality of through vias 140 and the redistribution structure 120, where a height of the encapsulation material 142 is greater than a height of the semiconductor die 130 and a height of the through vias 140.

In one embodiment, the material of the encapsulation material 142 includes epoxy resins, phenolic resins or silicon-containing resins, or any suitable materials, for example. In some embodiments, the encapsulation material 142 may further include inorganic fillers or inorganic materials (e.g., silica, clay and the like) which can be added therein to optimize coefficient of thermal expansion (CTE) of the encapsulation material 142.

Figure 5:
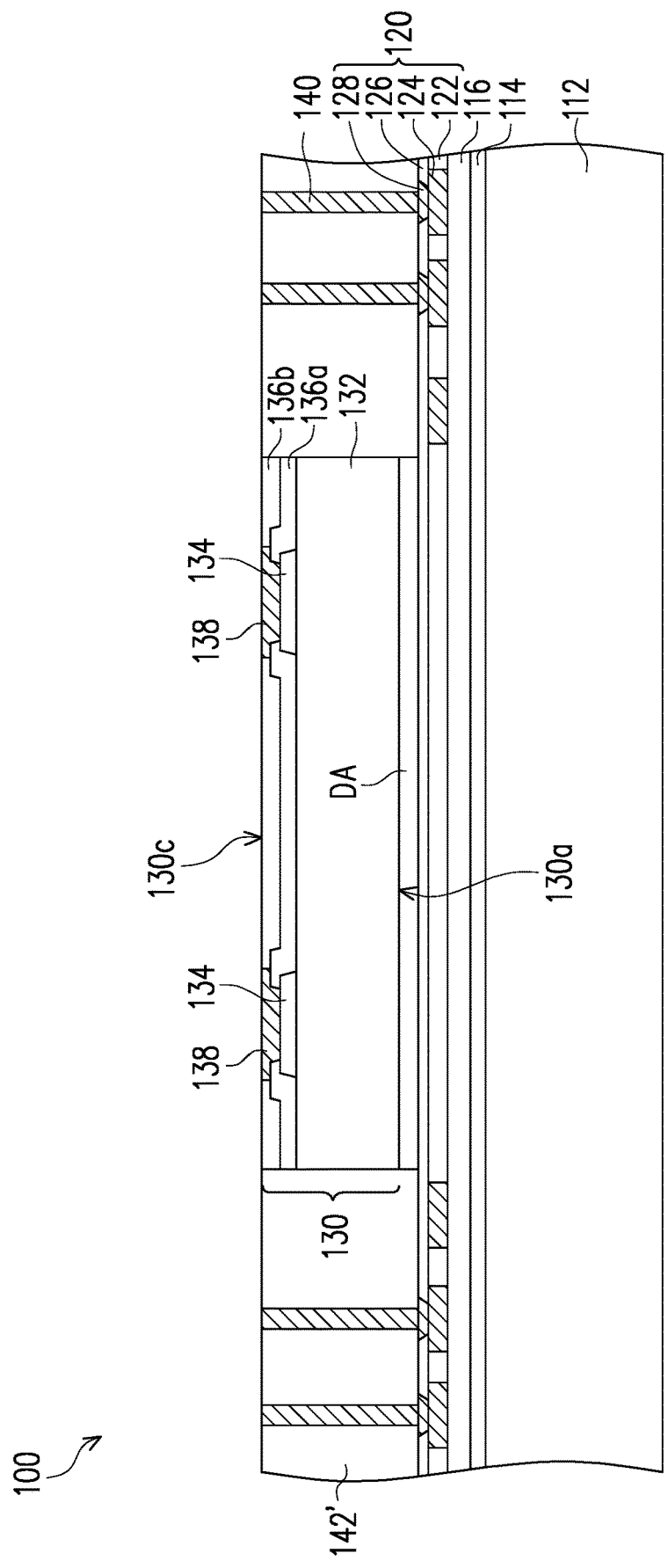

Referring to FIG. 5, in some embodiments, a planarization process is performed to form the encapsulant 142'. In some embodiments, the encapsulation material 142 and the protection layer 136b of the semiconductor die 130 are polished or grinded until the conductive pillars 138 and the through vias 140 are exposed. In some embodiments, the encapsulation material 142 is partially removed to expose the through vias 140. The encapsulant 142' is formed over the redistribution structure 120 and surrounds the semiconductor die 130 and the through vias 140. In some embodiments, the encapsulation material 142 is grinded by a mechanical grinding process and/or a chemical mechanical polishing (CMP) process. After the polishing or grinding step, a cleaning step may be optionally performed to clean and remove the residues generated from the grinding or polishing step. However, the disclosure is not limited thereto, and the grinding step may be performed through any other suitable method. In some embodiments, during the planarization process, the protection layer 136b is grinded to reveal the conductive pillars 138. In some embodiments, portions of the conductive pillars 138 and portions of the through vias 140 are also slightly grinded during the planarization process. After the planarization process, the semiconductor die 130 has an active surface 130c exposed from the encapsulant 142' and a rear surface 130a opposite to the active surface 130c.

As shown in FIG. 5, the encapsulant 142' laterally encloses the semiconductor die 130 and the through vias 140. In some embodiments, the semiconductor die 130 and the through vias 140 are embedded in the encapsulant 142', but the top surfaces of the through vias 140 and the active surface 130c of the semiconductor die 130 are exposed. In some embodiments, through the planarization, the top surfaces of the through vias 140 as well as the top surfaces of the conductive pillars 138 and the protection layer 136b of the semiconductor die 130 become substantially levelled with the top surface of the encapsulant 142'. In other words, the top surfaces of the through vias 140 as well as the top surfaces of the conductive pillars 138 and the protection layer 136b of the semiconductor die 130 are coplanar with the top surface of the encapsulant 142'.

Figure 6:
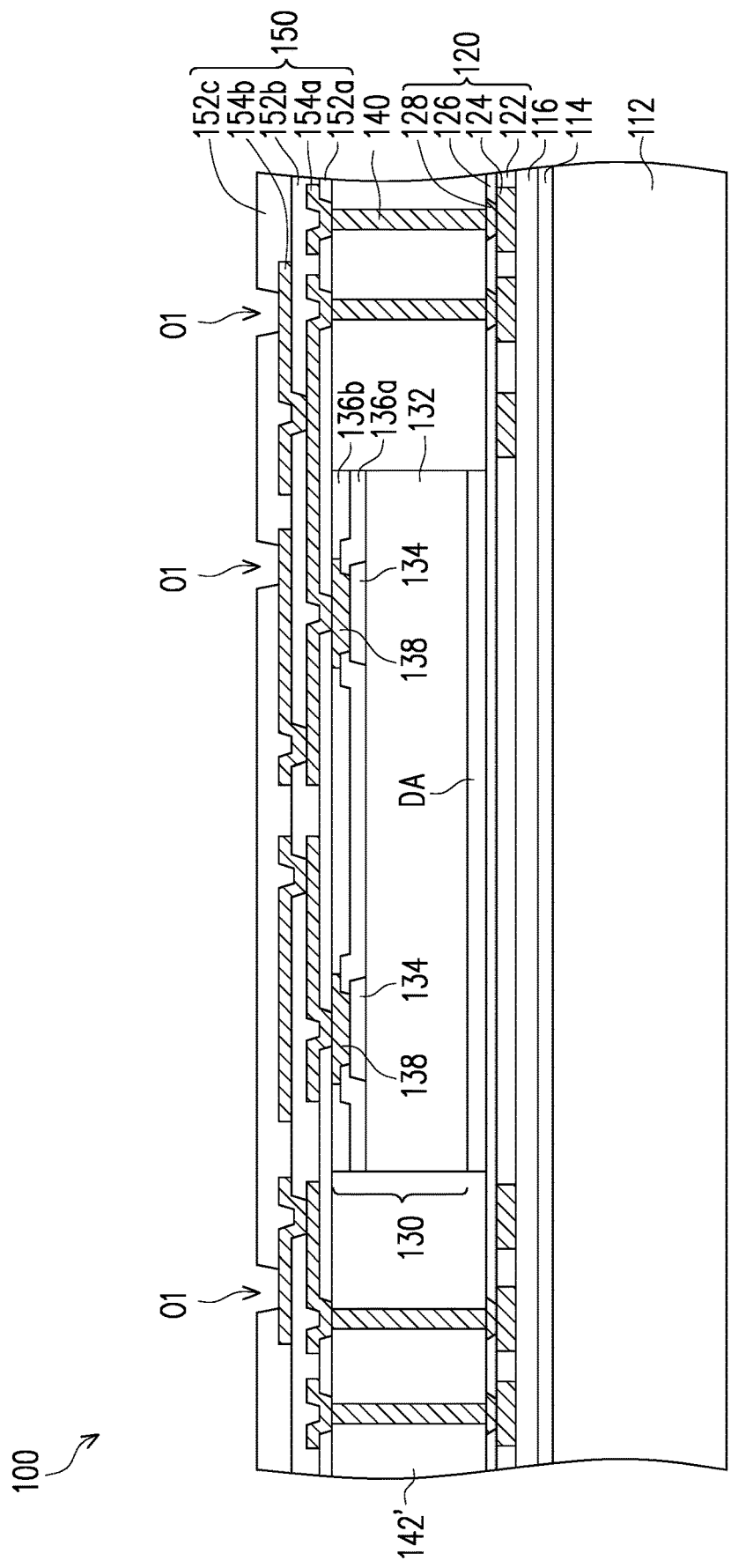

Referring to FIG. 6, in some embodiments, redistribution sublayers 150 are formed over the carrier 112. In some embodiments, the redistribution sublayers 150 are formed on the top surfaces of the conductive pillars 138 and the protection layer 136b of the semiconductor die 130, the top surfaces of the through vias 140 and the top surface of the encapsulant 142'. In certain embodiments, the redistribution sublayers 150 are formed as part of a redistribution structure 160 and the redistribution sublayers 150 are mechanically and electrically connected to the conductive pillars 138 of the semiconductor die 130. The later-formed redistribution structure 160 (FIG. 14) provides routing and redistribution functions for the semiconductor die 130. In some embodiments, the later-formed redistribution structure 160 (FIG. 14) is a front-side redistribution structure electrically connected to the semiconductor die 130. In certain embodiments, the redistribution structure 160 is mechanically and electrically connected to the redistribution structure 120 through the through vias 140. The formation of the redistribution sublayers 150 includes sequentially forming one or more polymer dielectric layers and one or more metallization layers in alternation.

In some embodiments, the method of forming the redistribution sublayers 150 includes the following steps. First, a polymer dielectric layer 152a is formed on the top surfaces of the through vias 140, the top surfaces of the conductive pillars 138 and the protection layer 136b of the semiconductor die 130. The polymer dielectric layer 152a includes a plurality of openings for exposing the through vias 140 and portions of the conductive pillars 138. A seed layer (not shown) is then formed on the top surface of the polymer dielectric layer 152a and extending into the openings of the polymer dielectric layer 152a. The seed layer may be formed by a physical vapor deposition process or the like. Then, a patterned photoresist layer (not shown) having a plurality of openings exposing portions of the seed layer is formed over the seed layer.

Then, a plating process is performed to form a plurality of conductive wirings 154a on the seed layer within the openings of the patterned photoresist layer. Thereafter, the patterned photoresist layer is removed and the seed layer not covered by is removed (e.g., by an etching process). A polymer dielectric layer is then formed to cover the conductive wirings 154a. In some embodiments, a planarizing process is performed to level the top surface of the polymer dielectric layer. After performing the planarizing process on the polymer dielectric layer, the polymer dielectric layer is patterned to form a polymer dielectric layer 152b including a plurality of openings exposing portions of the conductive wirings 154a. A seed layer (not shown) is then formed on the top surface of the polymer dielectric layer 152b and extending into the openings of the polymer dielectric layer 152b. The seed layer may be formed by a physical vapor deposition process or the like. Then, a patterned photoresist layer (not shown) having a plurality of openings exposing portions of the seed layer is formed over the seed layer.

Then, a plating process is performed to form a plurality of conductive wirings 154b on the seed layer within the openings of the patterned photoresist layer. Thereafter, the patterned photoresist layer is removed and the seed layer not covered by is removed (e.g., by an etching process). A polymer dielectric layer is then formed to cover the conductive wirings 154b. In some embodiments, a planarizing process is performed to level the top surface of the polymer dielectric layer. After performing the planarizing process on the polymer dielectric layer, the polymer dielectric layer is patterned to form a polymer dielectric layer 152c including a plurality of openings O1 exposing portions of the conductive wirings 154b.

FIG. 7 to FIG. 12 are schematic cross sectional views of various stages in a manufacturing method of topmost redistribution wirings and the conductive vias of the redistribution structure 160 according to some exemplary embodiments of the present disclosure. In some embodiments, the methods illustrated in FIG. 7 to FIG. 12 are used for manufacturing thicker redistribution wirings and conductive vias thereon. In some embodiments, the methods described in this disclosure are suitable for forming vias of large aspect ratios. In some embodiments, the thicker redistributions may have a thickness ranging from about 1 micron to about 50 microns, for example. In some embodiments, a thickness of the thicker redistribution wirings is larger than a thickness of the underlying conductive wirings 154a or the conductive wirings 154b. In some embodiments, a thickness of the conductive vias on the thicker redistribution wirings is larger than the thickness of the conductive wirings 154a or the conductive wirings 154b.

Figure 7:
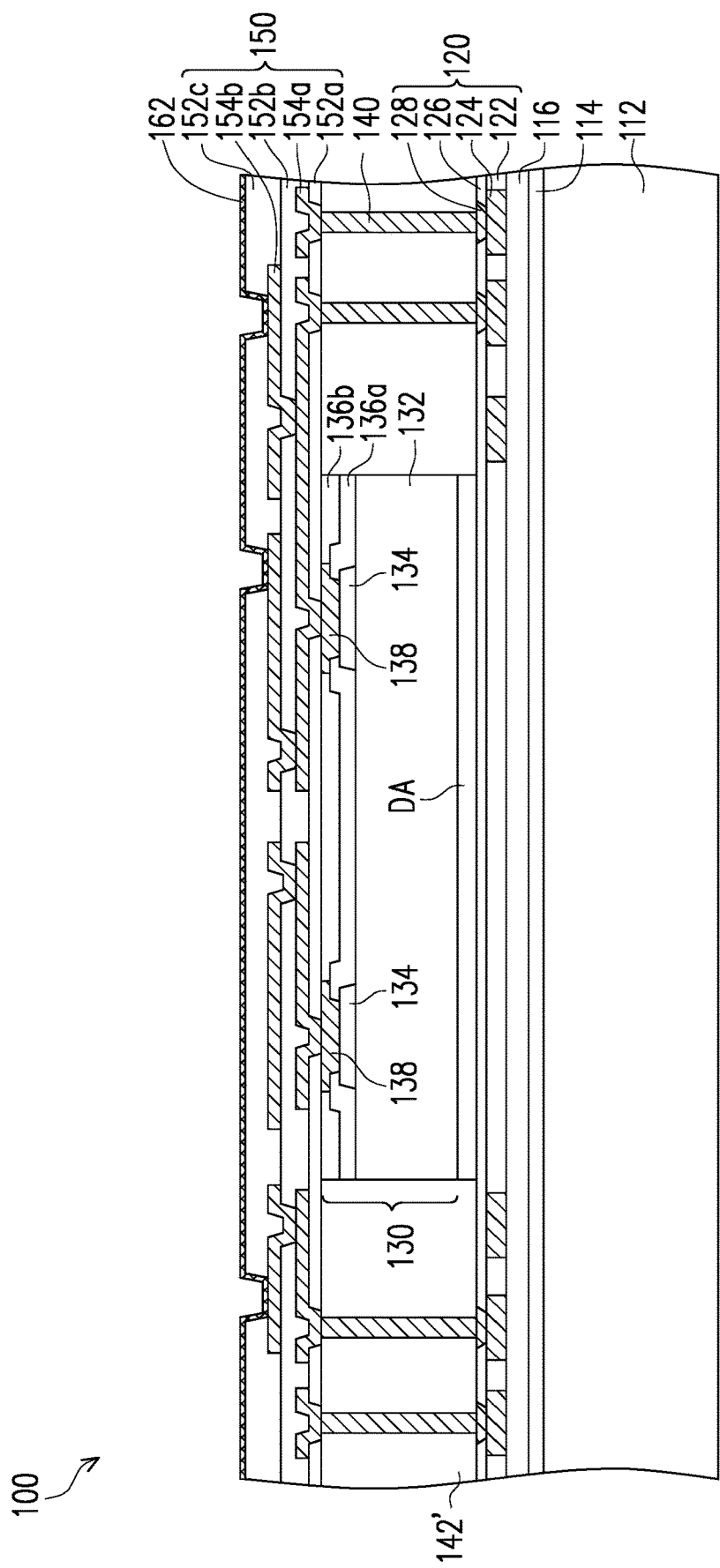

Referring to FIG. 7, in some embodiments, a seed layer 162 is formed on the top surface of the polymer dielectric layer 152c and extending into the openings of the polymer dielectric layer 152c. In some embodiments, the seed layer 162 may be a composite layer including a plurality of sub-layers formed of different materials, such as titanium, titanium nitride, copper and combinations thereof. In some embodiments, the seed layer 162 includes a composite of a titanium layer and a copper layer over the titanium layer. The seed layer 162 may be formed by a physical vapor deposition process (e.g., a sputtering process or an evaporation process), a chemical deposition process (such as atomic layer deposition) or the like. In some embodiments, the seed layer 162 functions as a seed layer for the subsequent plating process and a barrier layer for avoid diffusion and improving adhesion between the polymeric dielectric layer and the metallic redistribution wirings.

Figure 8:
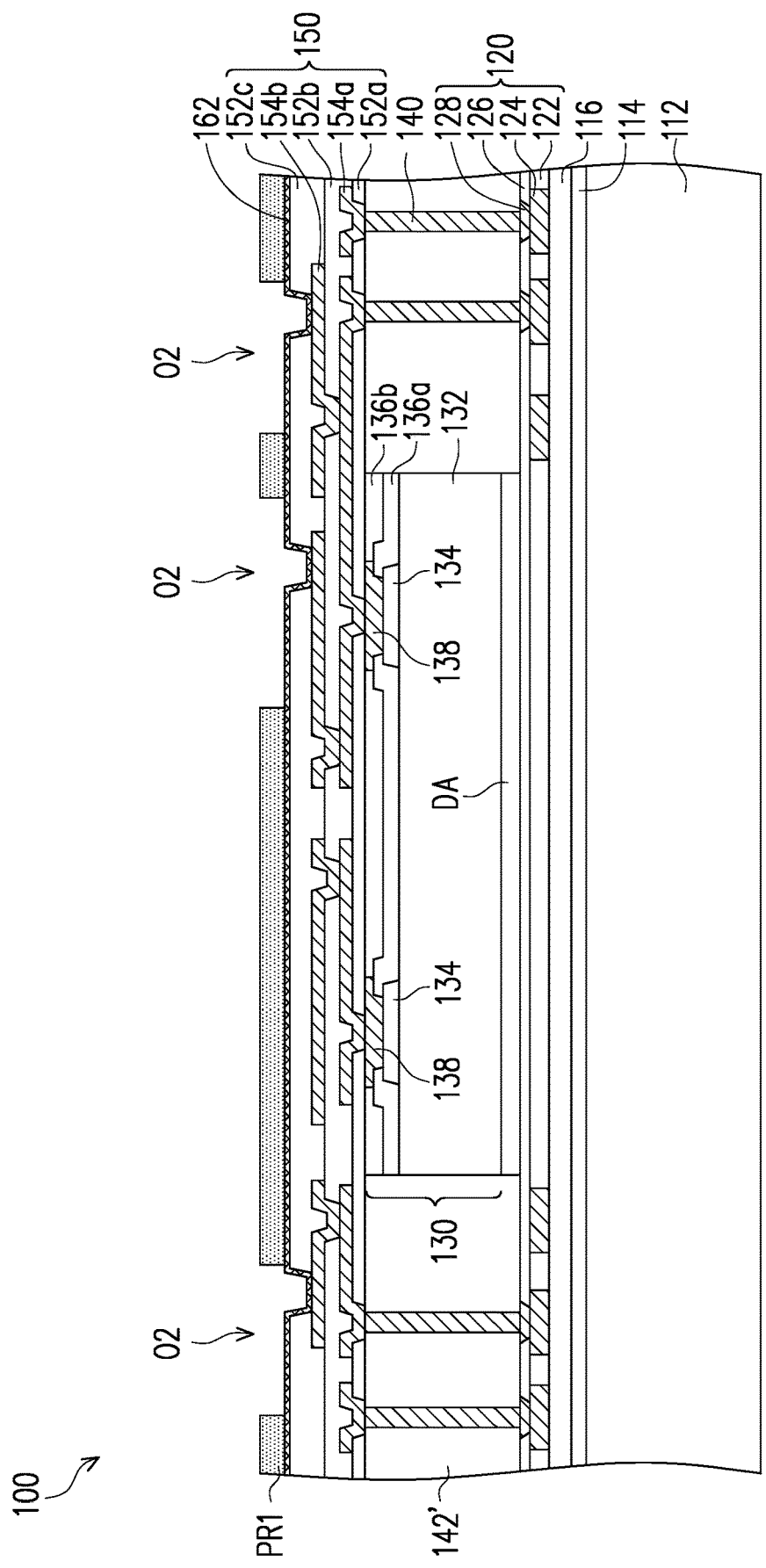

Referring to FIG. 8, in some embodiments, a first patterned photoresist layer PR1 is formed over the seed layer 162 through a photolithography process. The first patterned photoresist layer PR1 includes a plurality of openings O2 for exposing portions of the seed layer 162 at least corresponding to the openings O1 defined in the polymer dielectric layer 152c.

Figure 9:
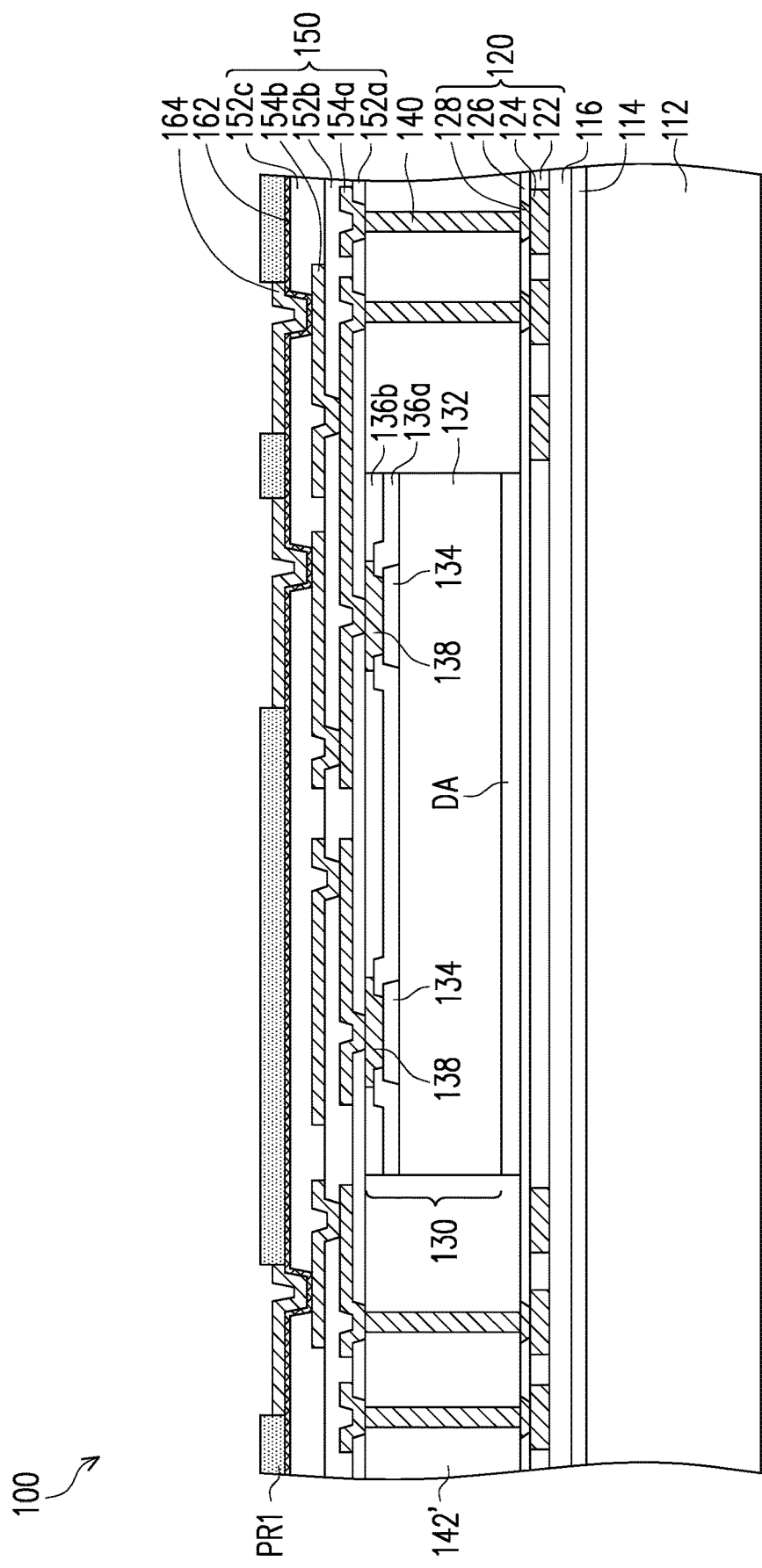

Referring to FIG. 9, in some embodiments, a first plating process is performed on the seed layer 162 exposed by the openings O2 of the first patterned photoresist layer PR1 such that a plurality of redistribution wirings 164 are formed on the seed layer 162 and in the openings O2 defined in the first patterned photoresist layer PR1. In some embodiments, the seed layer 162 functions as a seed layer for the plating process to form redistribution wirings 164. In some embodiments, the redistribution wirings 164 may partially fill the openings O2 of the first patterned photoresist layer PR1. In other words, the top surfaces of the redistribution wirings 164 may be lower than the top surface of the first patterned photoresist layer PR1. In some alternative embodiments, the redistribution wirings 164 may fully fill the openings O2 of the first patterned photoresist layer PR1.

Figure 10:
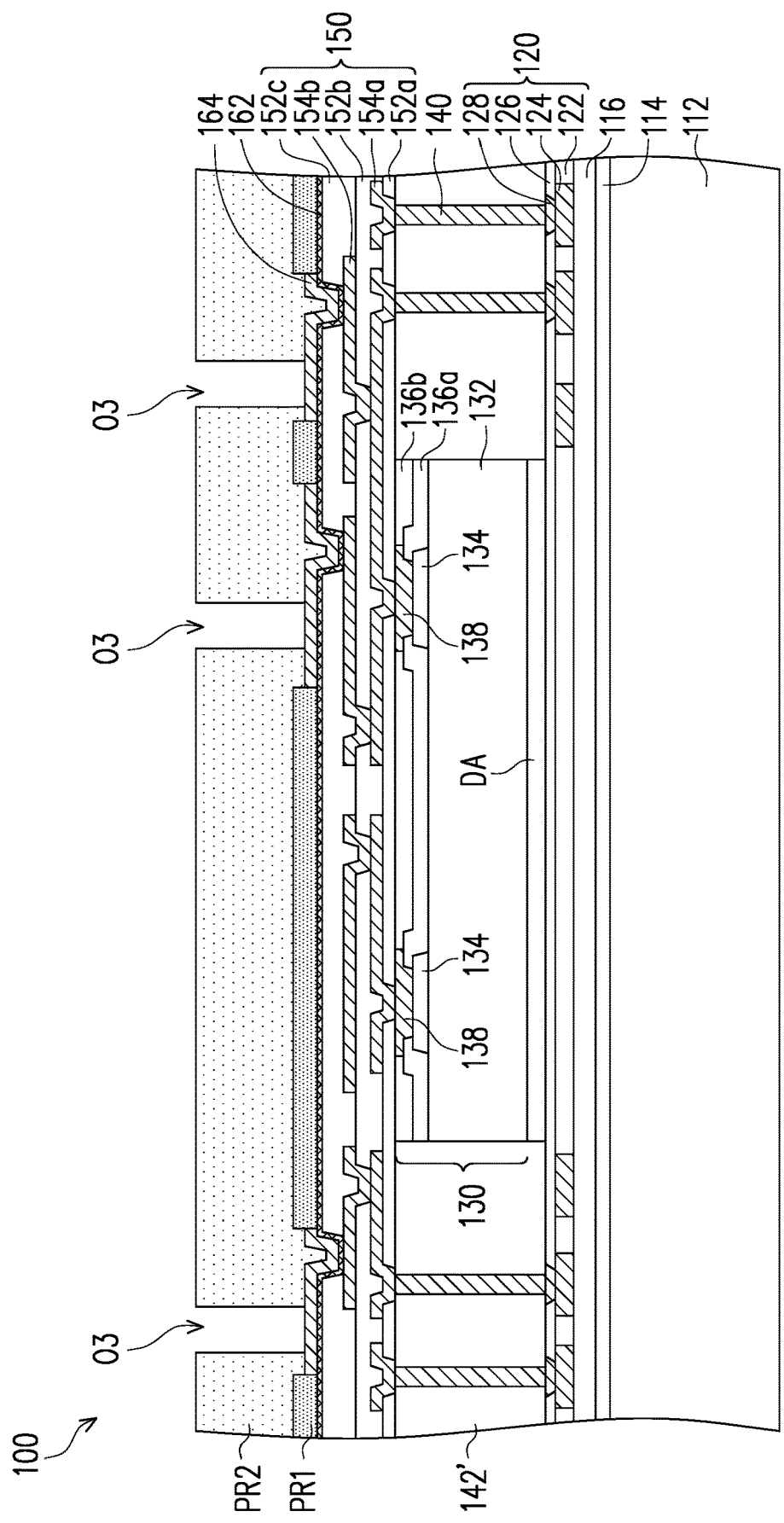

Referring to FIG. 10, in some embodiments, after the redistribution wirings 164 are formed, a second patterned photoresist layer PR2 is formed on the first patterned photoresist layer PR1 and the redistribution wirings 164 through a photolithography process. The second patterned photoresist layer PR2 includes a plurality of openings O3 for exposing portions of the redistribution wirings 164. As shown in FIG. 10, the second patterned photoresist layer PR2 is formed directly on and in contact with the first patterned photoresist layer PR1 and the redistribution wirings 164.

In some embodiments, the second patterned photoresist layer PR2 is formed directly on the first patterned photoresist layer PR1, and no stripping or ashing process is performed after the formation of the redistribution wirings 164. That is, the first patterned photoresist layer PR1 is not removed before the formation of the second patterned photoresist layer PR2. If the first patterned photoresist layer PR1 is removed before forming the second patterned photoresist layer PR2, bubbles may be generated between the second patterned photoresist layer PR2 and the underlying structures (i.e., the seed layer 162 and the redistribution wirings 164) since the removal of the first patterned photoresist layer PR1 may cause the outer contour of the seed layer 162 and the redistribution wirings 164 to be uneven and lead to greater step height. Therefore, forming the second patterned photoresist layer PR2 without removing the first patterned photoresist layer PR1 not only skips one ashing or stripping process but also minimizes the generation of bubbles under the second patterned photoresist layer PR2.

In some embodiments, portions of the second patterned photoresist layer PR2 extends into the openings O2 of the first patterned photoresist layer PR1. The second patterned photoresist layer PR2 may cover the top surfaces of the first patterned photoresist layer PR1, portions of the sidewalls of the first patterned photoresist layer PR1 and portions of the top surfaces of the redistribution wirings 164.

In some embodiments, the forming method of the second patterned photoresist layer PR2 is different from the forming method of the first patterned photoresist layer PR1. For example, the first patterned photoresist layer PR1 is formed by spin-coating, and the second patterned photoresist layer PR2 is formed by dry film lamination. In some embodiments, the material of the second patterned photoresist layer PR2 is different from the material of the first patterned photoresist layer PR1. In some alternative embodiments, the forming method of the second patterned photoresist layer PR2 is the same as forming the method of the first patterned photoresist layer PR1. The material of second patterned photoresist layer PR2 is the same as the material of the first patterned photoresist layer PR1.

Figure 11:
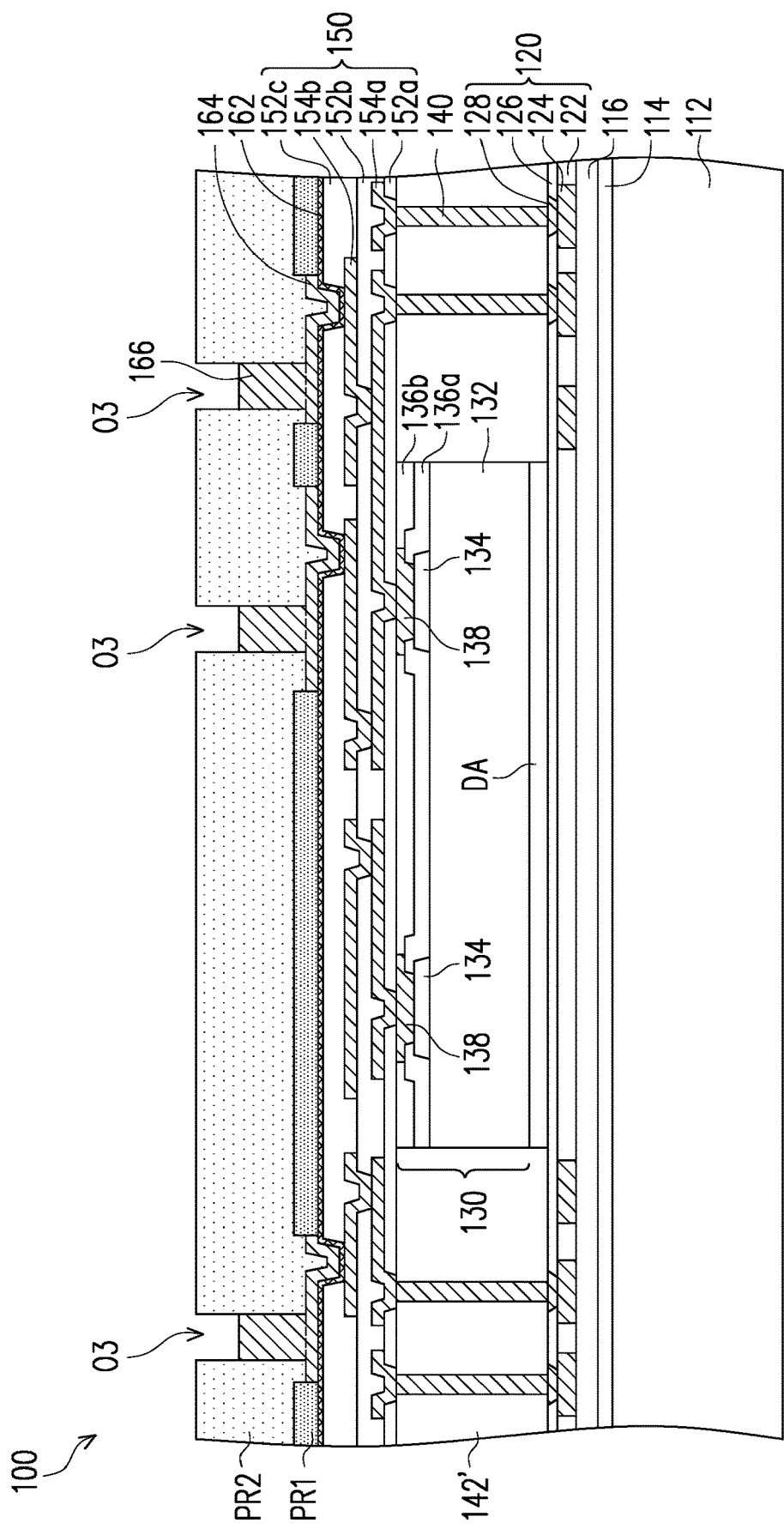

Referring to FIG. 11, in some embodiments, a second plating process is performed on the redistribution wirings 164 exposed by the openings O3 of the second patterned photoresist layer PR2 such that a plurality of conductive vias 166 are formed on the redistribution wirings 164 and in the openings O3 defined in the second patterned photoresist layer PR2. The conductive vias 166 may be formed on the redistribution wirings 164 without forming another seed layer formed between the conductive vias 166 and the redistribution wirings 164 since the seed layer 162 under the redistribution wirings 164 still exists. In some embodiments, the seed layer 162 functions as a seed layer for the plating process to form the conductive vias 166. As shown in FIG.

11, the conductive vias 166 are formed directly on and in physical contact with the redistribution wirings 164.

In some embodiments, the conductive vias 166 may partially fill the openings O3 of the second patterned photoresist layer PR2. In other words, the top surfaces of the conductive vias 166 may be lower than the top surface of the second patterned photoresist layer PR2. In some alternative embodiments, the conductive vias 166 may fully fill the openings O2 of the second patterned photoresist layer PR2.

Figure 12:
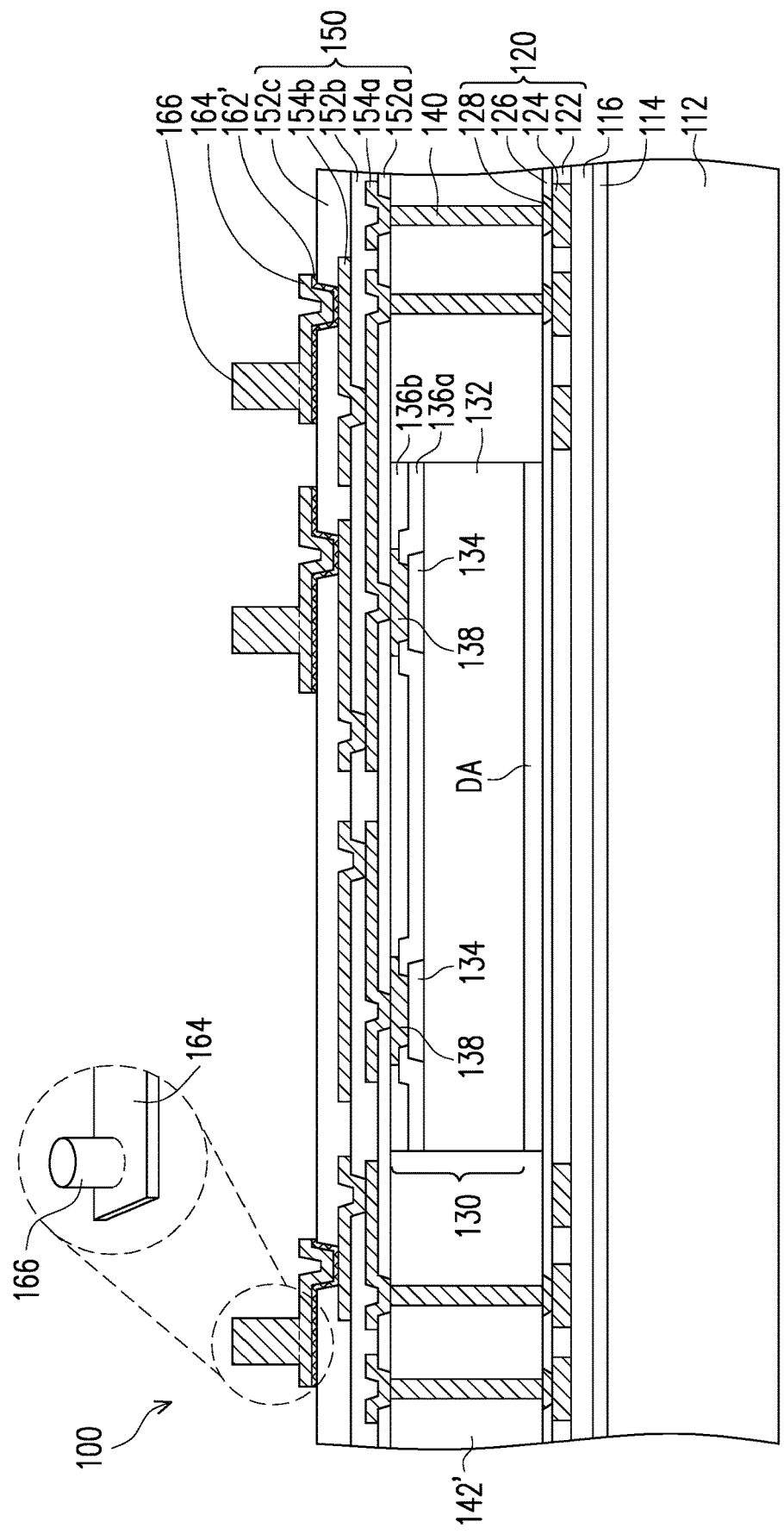

Referring to FIG. 12, in some embodiments, after the conductive vias 166 are formed, the first patterned photoresist layer PR1 and the second patterned photoresist layer PR2 are removed in a single process. That is, the first patterned photoresist layer PR1 and the second patterned photoresist layer PR2 are removed without changing the processing platform. In some embodiments, the first patterned photoresist layer PR1 and the second patterned photoresist layer PR2 are simultaneously removed by using one stripping solution. In some embodiments, the first patterned photoresist layer PR1 and the second patterned photoresist layer PR2 are removed by using a mixture of plural stripping solutions. In some embodiments, the first patterned photoresist layer PR1 and the second patterned photoresist layer PR2 are removed by a plasma ashing process. In some embodiments, the first patterned photoresist layer PR1 and the second patterned photoresist layer PR2 are sequentially removed. In some alternative embodiments, the first patterned photoresist layer PR1 and the second patterned photoresist layer PR2 are removed at the same time.

Thereafter, portions of the seed layer 162 that are not covered by the redistribution wirings 164 are removed (e.g., by an etching process) such that a patterned seed layer 162' is formed under the redistribution wirings and covered by the redistribution wirings 164. At this stage, the conductive vias 166 connected with the redistribution wirings 164 together with the underlying patterned seed layer 162' are substantially completed as part of the redistribution structure 160. As shown in FIG. 12, a stereogram of a portion the redistribution wirings 164 and the conductive vias 166 is also illustrated. —The conductive vias 166 are solid pillars formed directly on and in physical contact with the redistribution wirings 164. No seed layer is formed between the conductive vias 166 and the redistribution wirings 164.

For a seed layer including a titanium layer and a copper layer over the titanium layer, the titanium layer of the seed layer may be laterally recessed from the respective edges of the respective overlying plated material due to lateral over-etching, and there may be undercuts formed directly under the edge portions of the overlying plated material. The undercuts may cause the deformation and/or delamination of the overlying plated material, thereby causing the degradation of the reliability. In some embodiments, since no seed layer is formed between the redistribution wirings 164 and the conductive vias 166 and the removal of the seed layer right under the conductive vias 166 is not needed, the conductive vias 166 are formed with little or no undercut under the edge portions of the conductive vias 166.

In some embodiments, the material of the polymer dielectric layers 152a, 152b, 152c may include polyimide, benzocyclobutene (BCB), polybenzoxazole (PBO), or any other suitable polymer-based dielectric material. In some embodiments, the material of redistribution wirings 164 and the conductive vias 166 may include aluminum, titanium, copper, nickel, tungsten, and/or alloys thereof.

In some embodiments, materials of the redistribution wirings 164 and the conductive vias 166 may be the same (for example, copper). In this case, as the redistribution wirings 164 and the conductive vias 166 are formed of the same material and no seed or barrier layer sandwiched between the redistribution wirings 164 and the conductive vias 166 (i.e. the conductive via 166 directly located on the redistribution wirings 164), adhesion between the redistribution wirings 164 and the conductive vias 166 is significantly increased. In some embodiments, there is barely interface between the conductive via 166 and the redistribution wirings 164, and the integrity greatly reinforce the structural strength of the conductive via 166 connected with the redistribution wirings 164. Therefore, delamination of the overlying conductive vias 166 may not easily occur, so that higher design flexibility of the conductive vias 166 may be achieved. In some embodiments, the conductive via 166 is landed fully on the redistribution wiring 164. In some embodiments, only a portion of one conductive via 166 is landed directly on the underlying redistribution wiring 164. The conductive via 166 is located on an edge portion of the underlying redistribution wiring 164 and extends into a space between the underlying redistribution wiring 164 and another adjacent redistribution wiring 164. In some embodiments, the space under the exposed bottom surface of the conductive via 166 may be filled with encapsulation materials in the subsequent process.

Figure 13:
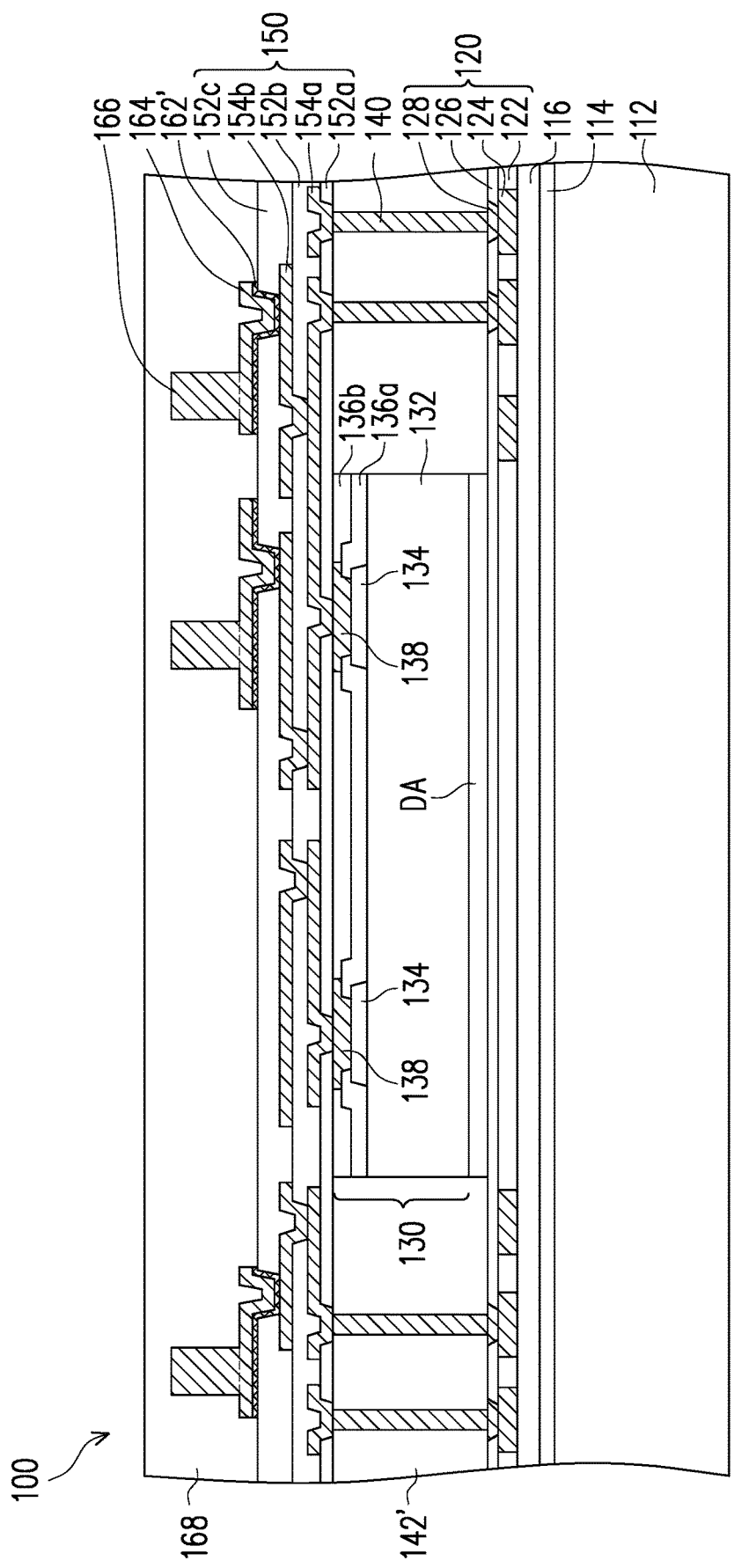

Referring to FIG. 13, in some embodiments, the redistribution wirings 164 and the conductive vias 166 are encapsulated in the encapsulation material 168. In some embodiments, the encapsulation material 168 covers the redistribution wirings 164 and the conductive vias 166, where the redistribution wirings 164 and the conductive vias 166 are not accessibly revealed by the encapsulation material 168. In some embodiments, the encapsulation material 168 is formed over the redistribution wirings 164 and the conductive vias 166. For example, as shown in FIG. 13, the encapsulation material 168 covers the redistribution wirings 164 and the conductive vias 166. In other words, the encapsulation material 168 is over-molded over the redistribution wirings 164 and the conductive vias 166.

In some embodiments, the encapsulation material 168 and the polymer dielectric layers 152a, 152b, 152c of the redistribution structure 160 are made of different materials. In one embodiment, the material of the encapsulation material 168 includes epoxy resins or phenolic resins, and the material of the polymer dielectric layers 152a, 152b, 152c includes polyimide, benzocyclobutene (BCB) or polybenzoxazole (PBO). In some embodiments, the encapsulation material 168 may further include inorganic filler or inorganic compound (e.g., silica, clay, and so on) which can be added therein to optimize coefficient of thermal expansion (CTE) of the encapsulation material 168.

Figure 14:
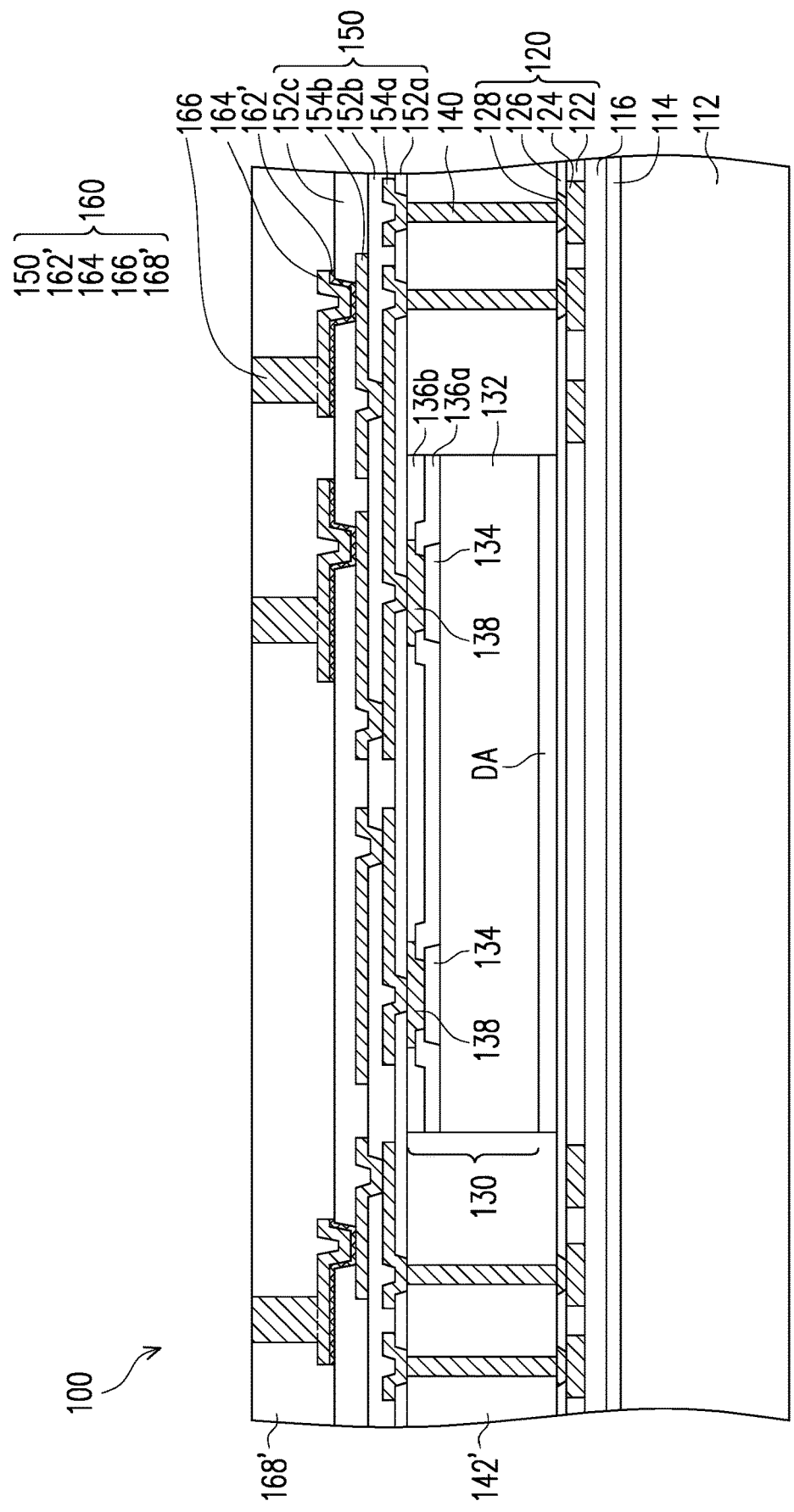

Referring to FIG. 14, in some embodiments, the encapsulation material 168 is grinded until top surfaces of the conductive vias 166 are exposed. After the encapsulation material 168 is grinded, an encapsulant 168' is formed over the redistribution sublayers 150 to encapsulate the redistribution wirings 164 and the conductive vias 166. In some embodiments, the encapsulation material 168 is grinded by a mechanical grinding process and/or a chemical mechanical polishing (CMP) process. After the grinding step, a cleaning step may be optionally performed, for example to clean and remove the residue generated from the grinding g step. However, the disclosure is not limited thereto, and the grinding step may be performed through any other suitable method. In some embodiments, portions of the conductive vias 166 are slightly grinded as well.

As shown in FIG. 14, the encapsulant 168' laterally surrounds the redistribution wirings 164 and the conductive vias 166. In other words, the redistribution wirings 164 and the conductive vias 166 are embedded in the encapsulant 168' with top surfaces of the conductive vias 166 exposed from the encapsulant 168'. In some embodiments, after the grinding, the top surfaces of the conductive vias 166 become substantially levelled with the top surface of the encapsulant 168'. In other words, the top surfaces of the conductive vias 166 are coplanar with the top surface of the encapsulant 168'.

Figure 15:
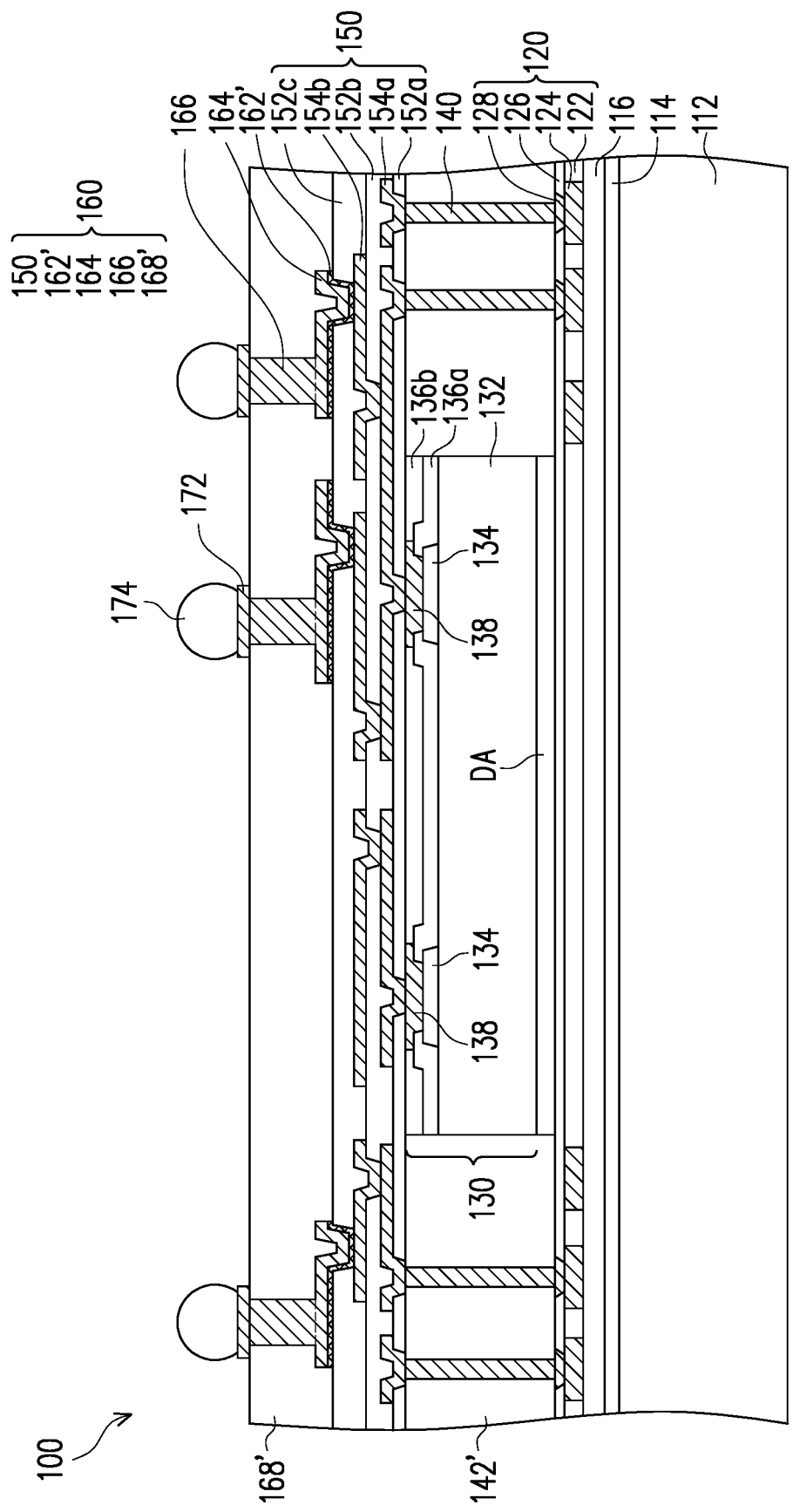

Referring to FIG. 15, in some embodiments, a plurality of under-ball metallurgy (UBM) patterns 172 and a plurality of conductive connectors 174 disposed on the UBM patterns 172 are formed on the conductive vias 166. In some embodiments, the material of the UBM patterns 172 may include copper, nickel, titanium, tungsten, combinations or alloys thereof. In some embodiments, the UBM patterns 172 may be formed by an electroplating process, a deposition process or combinations thereof, for example. In some embodiments, the conductive connector 174 includes a conductive bump or a solder ball. In some embodiments, the conductive connectors 174 may be placed on the UBM patterns 172 through a ball placement process. In some embodiments, the UBM patterns 172 may be optional. In some embodiments, the configurations of the UBM patterns 172 and the conductive connectors 174 may be determined based on circuit design.

Figure 16:
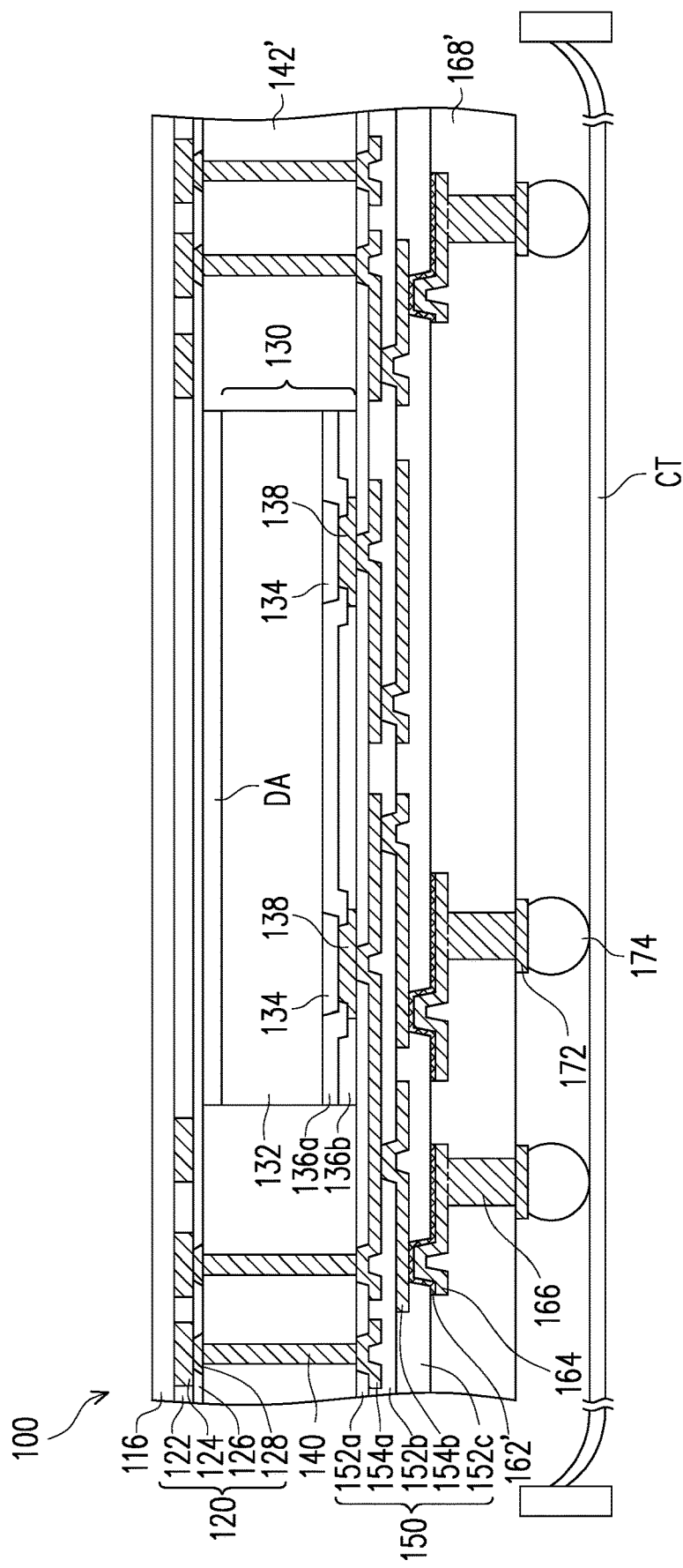

Referring to FIG. 16, in some embodiments, the structure 100 may be flipped (turned upside down) and placed on a carrier tape CT. Then, the carrier 112 is debonded and removed from the buffer layer 116. In some embodiments, the buffer layer 116 is easily separated from the carrier 112 due to the debond layer 114. In some embodiments, the carrier 112 is detached from the buffer layer 116 through a debonding process, where the carrier 112 and the debond layer 114 are removed, and the buffer layer 116 is exposed. In one embodiments, the debonding process is a laser debonding process. In some embodiments, the buffer layer 116 remained on redistribution structure 120 serves as a protection layer. Alternatively, in some embodiments, the buffer layer 116 may be subsequently removed, and a surface of the redistribution structure 120 may be exposed.

Figure 17:
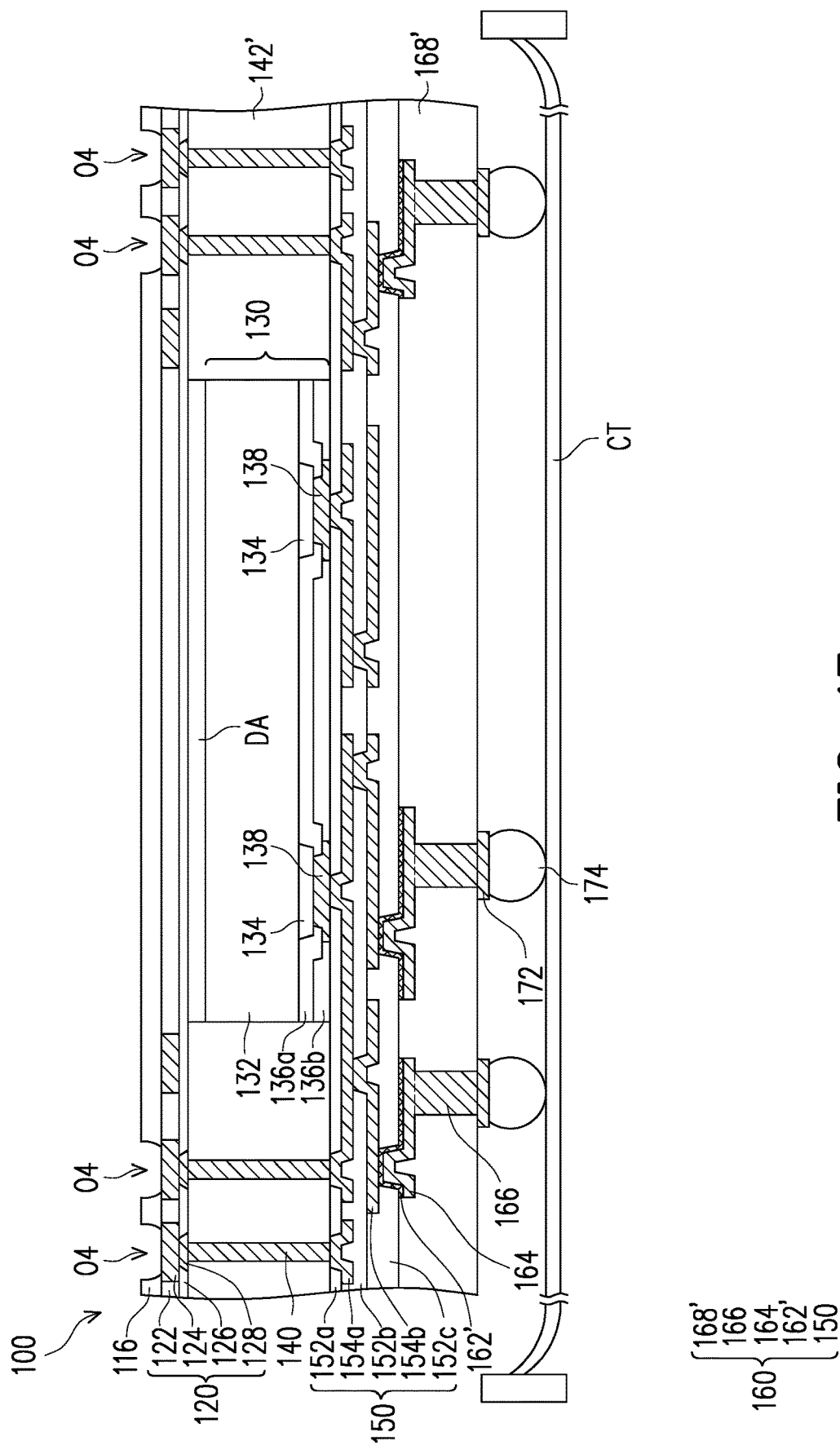

Referring to FIG. 17, in some embodiments, a plurality of openings O4 are formed in the buffer layer 116. The openings O4 at least partially expose the conductive line 124. In some embodiments, the number of the openings O4 corresponds to the number of the through vias 140. In some alternative embodiments, the number of the openings O4 may be more than the number of the through vias 140. In some embodiments, the openings O4 are formed through a laser drilling process. In alternative embodiments, the openings O4 are formed through etching in a lithography process.

Figure 18:
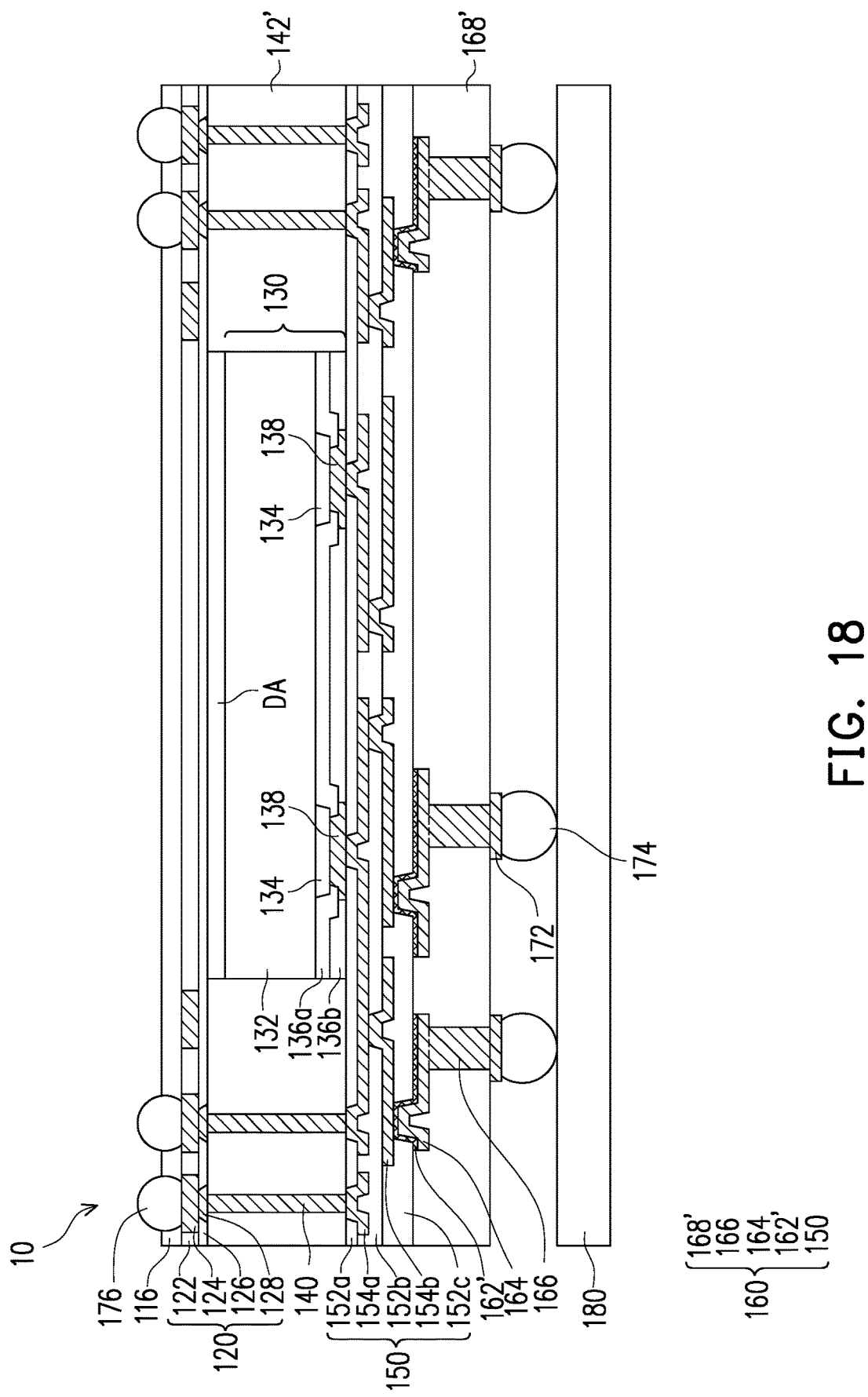

Referring to FIG. 18, in some embodiments, a plurality of conductive connectors 176 are formed in the openings O4 of the buffer layer 116. In some embodiments, the conductive connectors 176 protrude from the surface of the buffer layer 116 for future electrical connection. In some embodiments, after the conductive connectors 176 are formed, a singulation process may be performed to individualize the packages 10. In some embodiments, after the conductive connectors 176 are formed, another package may be further mounted or affixed to the package 10 and then the singulation process is performed to form a package-on-package structure. In some embodiments, the package 10 may be further mounted to a circuit substrate 180 (such as a printed circuit board) by connecting the conductive connector 174 to contact terminals of the circuit substrate 180.

In accordance with some embodiments of the disclosure, a method includes the following steps. A seed layer is formed over a structure having at least one semiconductor die. A first patterned photoresist layer is formed over the seed layer, wherein the first patterned photoresist layer includes a first opening exposing a portion of the seed layer. A metallic wiring is formed in the first opening and on the exposed portion of the seed layer. A second patterned photoresist layer is formed on the first patterned photoresist layer and covers the metallic wiring, wherein the second patterned photoresist layer includes a second opening exposing a portion of the metallic wiring. A conductive via is formed in the second opening and on the exposed portion of the metallic wiring. The first patterned photoresist layer and the second patterned photoresist layer are removed. The metallic wiring and the conductive via are laterally wrapped around with an encapsulant.

In accordance with some embodiments of the disclosure, a method of fabricating a semiconductor package includes the following steps. A semiconductor die is provided. A first encapsulant laterally encapsulates the semiconductor die. A redistribution structure is formed on the semiconductor die and the first encapsulant, wherein forming the redistribution structure over the semiconductor die and the first encapsulant includes the following steps. Redistribution sublayers including a dielectric layer and a metallic wiring are formed over the semiconductor die and the first encapsulant. A seed layer is formed on the dielectric layer covering the dielectric layer and the metallic wiring. A first patterned photoresist layer having a first opening is formed over the seed layer. A redistribution wiring is formed in the first opening and on the seed layer. A second patterned photoresist layer having a second opening is formed on the first patterned photoresist layer and the redistribution wiring. A conductive via is formed on the redistribution wiring and within the second opening. The first patterned photoresist layer and the second patterned photoresist layer are removed in a single process. A second encapsulant wrapping around the conductive via and the redistribution wiring is formed.

In accordance with some embodiments of the disclosure, a semiconductor package includes a semiconductor die, a first encapsulant, a redistribution structure and a second encapsulant is provided. The first encapsulant laterally encapsulates the semiconductor die. The redistribution structure is disposed on the semiconductor die and the first encapsulant and is electrically connected to the semiconductor die. The redistribution structure includes redistribution sublayers including a dielectric layer and a metallic wiring, a redistribution wiring disposed on the dielectric layer and connected to the metallic wiring, and a conductive via disposed on the redistribution wiring, wherein no seed layer is between the redistribution wiring and the conductive via. The second encapsulant laterally encapsulates the redistribution wiring and the conductive via, wherein the second encapsulant and the dielectric layer of the redistribution structure are made of different materials.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
forming a conductive wiring over at least one device;
forming a polymer layer over the conductive wiring, wherein the polymer layer has a zeroth opening exposing a portion of the conductive wiring;
forming a seed layer over a top surface of the polymer layer, wherein the seed layer extends into the zeroth opening of the polymer layer;
forming a first patterned photoresist layer over the seed layer, wherein the first patterned photoresist layer comprises a first opening exposing a portion of the seed layer in the zeroth opening of the polymer layer;
forming a metallic wiring in the first opening and on the exposed portion of the seed layer, wherein the metallic wiring fills in the zeroth opening of the polymer layer;
forming a conductive via on the metallic wiring; and
removing the first patterned photoresist layer.

2. The method as claimed in claim 1, wherein a method of forming the conductive via comprises:
forming a second patterned photoresist layer on the first patterned photoresist layer and covering the metallic wiring, wherein the second patterned photoresist layer comprises a second opening exposing a portion of the metallic wiring; and
forming the conductive via in the second opening and on the exposed portion of the metallic wiring.

3. The method as claimed in claim 2, wherein the second patterned photoresist layer is removed during removing the first photoresist layer after forming the conductive via.

4. The method as claimed in claim 2, wherein the second patterned photoresist layer is formed directly on the first patterned photoresist layer and the metallic wiring.

5. The method as claimed in claim 2, wherein a material of the first patterned photoresist layer is different from a material of the second patterned photoresist layer.

6. The method as claimed in claim 2, further comprising removing the seed layer not covered by the metallic wiring after removing the first patterned photoresist layer and the second patterned photoresist layer.

7. The method as claimed in claim 1, further comprising laterally wrapping around the metallic wiring and the conductive via with an encapsulant.

8. The method as claimed in claim 7, wherein laterally wrapping around the metallic wiring and the conductive via with the encapsulant comprises over-molding the metallic wiring and the conductive via followed by a grinding step.

9. The method as claimed in claim 1, wherein the conductive via is formed directly on the metallic wiring without a seed layer formed therebetween.

10. A method, comprising:
providing a semiconductor die;
laterally encapsulating the semiconductor die with a first encapsulant;
forming redistribution sublayers including a dielectric layer and a metallic wiring over the semiconductor die and the first encapsulant;
forming a redistribution wiring on the dielectric layer and electrically connected to the metallic wiring;
forming a conductive via on the redistribution wiring;
forming a second encapsulant wrapping around the conductive via and the redistribution wiring; and
forming an under-ball metallurgy (UBM) pattern on the conductive via, wherein a lower surface of the UBM pattern is coplanar with upper surfaces of the second encapsulant and the conductive via.

11. The method as claimed in claim 10, wherein a method of forming the redistribution wiring and the conductive via comprises:
forming a seed layer on the redistribution sublayers, wherein the seed layer extends continuously across the semiconductor die and covers the dielectric layer and the metallic wiring;
forming a first patterned photoresist layer having a first opening over the seed layer;
forming the redistribution wiring in the first opening and on the seed layer;
forming a second patterned photoresist layer having a second opening on the first patterned photoresist layer and the redistribution wiring;
forming the conductive via on the redistribution wiring and within the second opening; and
removing the first patterned photoresist layer and the second patterned photoresist layer.

12. The method as claimed in claim 11, wherein the first patterned photoresist layer and the second patterned photoresist layer are removed in a single process.

13. The method as claimed in claim 11, wherein the conductive via is formed directly on the redistribution wiring by plating using the seed layer as a plating seed layer without forming another seed layer between the conductive via and the redistribution wiring.

14. The method as claimed in claim 11, wherein the second patterned photoresist layer is formed directly on the first patterned photoresist layer after forming the redistribution wiring, so that the second patterned photoresist layer is in contact with the first patterned photoresist layer and in contact with the redistribution wiring.

15. The method as claimed in claim 11, wherein the first patterned photoresist layer is formed by spin-coating, and the second patterned photoresist layer is formed by dry film lamination.

16. The method as claimed in claim 10, wherein a material of the second encapsulant is different from a material of the dielectric layer.

17. A semiconductor package, comprising:
a semiconductor die; and
a redistribution structure, disposed on the semiconductor die and electrically connected to the semiconductor die, the redistribution structure comprising:
redistribution sublayers including a dielectric layer and a metallic wiring; and
a redistribution wiring disposed on the dielectric layer and connected to the metallic wiring;
a plurality of conductive vias disposed on the redistribution wiring; and
an encapsulant laterally encapsulating the redistribution wiring and the conductive via; and
a plurality of under-ball metallurgy (UBM) patterns respectively disposed on the conductive vias, wherein a lower surface each of the UBM patterns is coplanar with upper surfaces of the encapsulant and the corresponding conductive via.

18. The semiconductor package as claimed in claim 17, wherein the redistribution wiring is in physical contact with the conductive via.

19. The semiconductor package as claimed in claim 17, wherein the redistribution structure further comprises a seed layer sandwiched between the dielectric layer and the redistribution wiring.

20. The semiconductor package as claimed in claim 17, wherein a thickness of the metallic wiring is smaller than a thickness of the redistribution wiring or a thickness of the conductive via.

* * * * *